(12) United States Patent
Gruenwald et al.

(10) Patent No.: US 10,461,237 B2
(45) Date of Patent: Oct. 29, 2019

(54) THERMOELECTRIC DEVICE

(71) Applicant: Mahle International GmbH, Stuttgart (DE)

(72) Inventors: Juergen Gruenwald, Ludwigsburg (DE); Dirk Neumeister, Stuttgart (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 15/760,623

(22) PCT Filed: Sep. 14, 2016

(86) PCT No.: PCT/EP2016/071714
§ 371 (c)(1),
(2) Date: Mar. 15, 2018

(87) PCT Pub. No.: WO2017/046174
PCT Pub. Date: Mar. 23, 2017

(65) Prior Publication Data
US 2018/0254402 A1   Sep. 6, 2018

(30) Foreign Application Priority Data

Sep. 16, 2015  (DE) ........................ 10 2015 217 754

(51) Int. Cl.
*F25B 21/02* (2006.01)
*F25B 21/04* (2006.01)
(Continued)

(52) U.S. Cl.
CPC ......... *H01L 35/325* (2013.01); *D03D 1/0088* (2013.01); *F25B 21/04* (2013.01);
(Continued)

(58) Field of Classification Search
CPC .. F25B 21/02; F25B 21/04; F25B 2321/0252; H05K 2201/10219; H01L 35/32;
(Continued)

(56) References Cited

U.S. PATENT DOCUMENTS 2,768,424 A   10/1956  Andrus
3,019,278 A    1/1962  Fischer
(Continued)

FOREIGN PATENT DOCUMENTS

DE           19503291 A1   8/1996
DE       202006003595 U1   5/2006
(Continued)

OTHER PUBLICATIONS

English abstract for DE-202006003595.
(Continued)

*Primary Examiner* — Frantz F Jules
*Assistant Examiner* — Erik Mendoza-Wilkenfel
(74) *Attorney, Agent, or Firm* — Fishman Stewart PLLC

(57) ABSTRACT

A thermoelectric device may include a plurality of electrically conductive first threads and a plurality of electrically insulating second threads structured and arranged to define a fabric. At least one first thread of the plurality of first threads may include a plurality of p-doped thread sections and a plurality of n-doped thread sections arranged in alternating relationship with one another. The plurality of first threads may extend in a wavy course defining a plurality of curvature-turning points. The plurality of p-doped thread sections and the plurality of n-doped thread sections may be arranged in a respective curvature-turning point of the plurality of curvature-turning points.

18 Claims, 3 Drawing Sheets

(51) Int. Cl.
*H01L 35/08* (2006.01)
*H01L 35/32* (2006.01)
*D03D 1/00* (2006.01)

(52) U.S. Cl.
CPC .............. *H01L 35/08* (2013.01); *H01L 35/32* (2013.01); *D10B 2401/16* (2013.01)

(58) Field of Classification Search
CPC ..... H01L 35/325; H01L 35/08; D03D 1/0088; D10B 2401/16
See application file for complete search history.

(56) References Cited

U.S. PATENT DOCUMENTS

| | | | |
|---|---|---|---|
| 5,007,478 A * | 4/1991 | Sengupta | F28D 20/023 165/10 |
| 7,205,472 B2 | 4/2007 | Serras | |
| 8,378,206 B2 | 2/2013 | Schuette et al. | |
| 2004/0025930 A1 | 2/2004 | Serras | |
| 2005/0115600 A1 | 6/2005 | DeSteese et al. | |
| 2008/0023056 A1* | 1/2008 | Kambe | H01L 35/30 136/201 |
| 2010/0163283 A1* | 7/2010 | Hamedi | D03D 1/0088 174/254 |
| 2012/0060885 A1 | 3/2012 | Makansi et al. | |
| 2012/0198616 A1* | 8/2012 | Makansi | H01C 1/16 5/423 |
| 2012/0227778 A1* | 9/2012 | Leonov | H01L 35/30 136/200 |
| 2016/0369436 A1* | 12/2016 | Stewart | F16J 15/027 |

FOREIGN PATENT DOCUMENTS

| | | |
|---|---|---|
| DE | 102006055120 A1 | 5/2008 |
| DE | 102011115172 A1 | 3/2013 |
| DE | 102012018387 A1 | 3/2014 |
| DE | 102013110254 A1 | 3/2014 |
| EP | 1340060 A1 | 9/2003 |
| FR | 2080150 A5 | 11/1971 |
| GB | 2507316 A | 4/2014 |
| JP | H109969 A | 1/1998 |
| WO | 2008104312 A2 | 9/2008 |
| WO | 2014064455 A1 | 5/2014 |
| WO | 2015066518 A1 | 5/2015 |

OTHER PUBLICATIONS

English abstract for DE-102013110254.
English abstract for FR-2080150.
English abstract for DE-102012018387.
English abstract for DE-102011115172.
English abstract for JP-H109969.
English abstract for DE-19503291.

* cited by examiner

THERMOELECTRIC DEVICE

CROSS-REFERENCE TO RELATED APPLICATIONS

This application claims priority to International Patent Application No. PCT/EP2016/071714, filed on Sep. 14, 2016, and German Patent Application No. DE 10 2015 217 754.8, filed on Sep. 16, 2015, the contents of both of which are hereby incorporated by reference in their entirety.

TECHNICAL FIELD

The invention relates to a thermoelectric device, in particular for an air conditioning system of a motor vehicle, and to an air conditioning system having at least one such thermoelectric device.

BACKGROUND

In the vehicle interior, motor vehicles have a multiplicity of surfaces which because of their high surface temperature greatly heat up the vehicle interior when the vehicle is exposed to insolation over an extended period of time. Said surfaces therefore have to be initially at least surface-cooled by an air conditioning system of a motor vehicle in order to establish ambient conditions that are acceptable to the occupants of the motor vehicle. Desirable for this reason is a technology which brings about a rapid cooling of the surfaces of the vehicle interior even in the first seconds following the start-up of the air conditioning system.

In conventional motor vehicles, the cooling of the interior is exclusively accomplished by means of evaporation cooling by transferring cold to air flowing into the interior. Warm surfaces, which radiate into the interior, are thus only gradually cooled through convective transfer of heat to the flowing air.

Devices with shorter cooling time merely exist for surfaces in direct contact with the occupants: accordingly, an active seat cooling is known from the prior art for vehicles of the luxury class, in the case of which air flowing into the seat is actively cooled via Peltier element and flows out towards the occupant via pore-like apertures above the seat surface. Such a Peltier element comprises p and n-doped semiconductors, which are arranged alternately and electrically in series with each other. Electrically conductive contact bridges between the doped regions serve as heat absorption or heat emission element. In order to thermally and spatially separate a hot side from a cold side, these are alternately attached to a top or a bottom side of the Peltier element.

DE 195 03 291 C2 discloses a heating-cooling mat for a vehicle seat. The same comprises an air conditioning mat in which multiple Peltier elements are arranged, which for the voltage supply can be connected to an electrical system of a motor vehicle.

DE 10 2012 018 387 A1 deals with a thermoelectric generator having a thermoelectric substrate and a multiplicity of thermal pairs, wherein each thermal pair comprises a first thermoelectric conductor of a first thermoelectrically active material and a second thermoelectric conductor of a second thermoelectrically active material.

DE 10 2013 110 254 A1 deals with a thermoelectric element which comprises electrically conductive threads, thread bundles or filaments. These are designed in the form of conductive strands passing through a substrate.

EP 1 340 060 B1 deals with a method for producing thermoelectric converters with multiple thermoelectric elements arranged in series. By interweaving electrically conductive wires of two different materials, which are alternately arranged in parallel, these are formed with wires of electrically insulating material.

Disadvantageous in using conventional Peltier elements for actively cooling a vehicle interior is that the same are not suitable for cooling large-area surfaces.

SUMMARY

The present invention is based on the object of creating a thermoelectric device which is suitable for cooling heated-up surfaces with large surface area, in particular in the vehicle interior of a motor vehicle.

According to the invention, this object is solved through the subject matter of the independent patent claim(s). Advantageous further developments are the subject matter of the dependent patent claim(s).

Accordingly, the basic idea of the invention is to form a thermoelectric device as fabric with electrically conductive warp threads and with electrically insulating weft threads, or vice versa. This makes possible forming the thermoelectric device as flexible flat structure, which can be employed as part of a cooling device in an air conditioning system over a large area.

A thermoelectric device according to the invention comprises a plurality of electrically conductive first threads and a plurality of electrically insulating second threads which together form a fabric. The first threads can be warp threads of the fabric, and the second threads can be weft threads of the fabric or vice versa. For the thermoelectrically active design of the fabric, a plurality of p-doped and n-doped thread sections is alternately present in at least one first thread. Preferably, this applies to multiple, i.e. for at least first threads, particularly preferably to all first threads of the fabric. Each of the electrically conductive first threads not only forms a thermoelectric element but—depending on position relative to the electrically insulating second threads—also a hot side or a cold side of the thermoelectric device in sections.

Here, the term "fabric" expressly includes forms of realisation with which the person skilled in the art of textile technology is familiar under the designations "plain weave", "twill weave" and "satin weave".

Preferably, the second threads are of a thermally insulating design. In this way, undesirable heat bridges between the hot side and the cold side can be prevented.

In a further preferred embodiment, the first threads arranged in the fabric follow a wavy course with a plurality of curvature turning points, wherein the p and n-doped thread sections are arranged in the region of a respective curvature-turning point of the first thread. Non-doped regions between the thread sections can then function as hot side or cold side.

In a further preferred embodiment, the fabric is designed as flat structure. This makes possible using the fabric over a large area on surfaces that are not flat, such as are often present in the interior of a motor vehicle.

In order to achieve as high as possible an efficiency in the thermoelectric device according to the invention, the p-doped and the n-doped thread sections are arranged, in a further preferred embodiment, in the first threads in such a manner that a first side of the fabric forms a hot side and a second side of the fabric located opposite the first side forms a cold side, or vice versa.

In an advantageous further development of the invention, the first threads each comprise an electrically conductive conductor, preferentially of a metal, particularly preferably of copper, which is surrounded by an electrically insulating sheath. Preferably, the sheath consists of plastic. In this way, undesirable electrical short-circuits of individual electrically conductive first threads among each other or with other electrically conductive materials, which are present in the surroundings of the fabric, can be excluded.

In another preferred embodiment, the first threads and/or the second threads are formed ribbon-like. Such a flat formation of the first or second threads increases the cooling output that can be provided by the same, in particular when used in an air conditioning system.

Particularly practically, the individual first threads extend along a first direction, whereas the second threads extend along a second direction, which runs transversely to the first direction.

In a further preferred embodiment, all present first threads are connected electrically in series with each other. This reduces the wiring expenditure when connecting the first threads to an electric voltage source. This in turn results in substantial cost savings in producing the thermoelectric device.

In an advantageous further development, all present first threads can be integrally moulded one against the other. The resulting total thread can be particularly cost-effectively produced and particularly easily processed with the second threads to form a fabric. Furthermore, all first threads with this version do not have to be individually designed for connection to an electric voltage source but it is rather sufficient to connect the total thread with both its ends to such an electric voltage source. This likewise produces reduced manufacturing costs.

In an advantageous further development it is conceivable to combine an electric series connection and an electric parallel connection of the first threads with each other.

Particularly practically, the present first threads can be arranged, in a top view of the first and/or second side of the fabric, in a meander-like manner. In this way it can be ensured that on the cold side a homogeneous cooling output is achieved areally.

In another preferred embodiment, at least two, preferentially all, first threads can be electrically interconnected parallel to each other. In this way, the magnitude of the electric supply voltage required for operating the first threads as thermoelectric device—in particular compared with an electric series connection, can be reduced.

Since the fabric of the thermoelectric device itself only has a relatively low thermal capacity, it can generate a thermal cooling effect on the cold side only for a short time when loosely placed. Particularly practically, an additional heat accumulator for the buffer storing of heat can therefore be arranged on the hot side, which for the thermal coupling lies against the first threads. Said heat accumulator serves to absorb and temporarily buffer-store heat made available on the hot side.

Particularly preferably, the heat accumulator can be formed as heat accumulator plate, which is attached to the first threads by means of a thermally conductive adhesive material. This allows areally connecting the heat accumulator to the hot side of the thermoelectric device. Preferentially, the thermally conductive adhesive means is an adhesive.

Particularly practically, the heat accumulator can comprise a mechanically flexible material. In this way, the desired mechanical and thermal connection to the fabric of the thermoelectric device can be ensured even when the fabric is not designed entirely flat.

A further preferred version proves to be technically particularly easily and thus cost-effectively realisable, in which the heat accumulator comprises a flexible envelope, preferentially of a metal, particularly preferably a metal film. In this version, a liquid or a PCM material for absorbing the heat to be stored is arranged in the flexible envelope.

In a further preferred embodiment, an sheath thickness of the electrically insulating sheath of at least one first thread can be increased in at least one transition region between a p or n-doped thread section and the thread section without doping adjacent thereto for the purpose of pull relief. In this way, the strength of the first thread concerned is significantly improved in particular when subjected to tensile loading.

In another preferred embodiment, a in particular additional sheathing for pull relief can be provided in at least one first thread in at least one transition region between a p or n-doped thread section and the thread section without doping adjacent thereto. "Additional" means that this sheathing can be provided in addition to the electrically insulating sheathing described above. In this way, the strength of the first thread concerned, in particular when subjected to tensile load, is improved. Such "additional sheathing" can also be provided when the electrically insulating sheathing is omitted.

In a version of the invention, the first threads and second threads of the fabric can be switched, i.e. in such a scenario, the first threads have the properties of the previously described second threads and the second threads the properties of the first threads described above.

Further important features and advantages of the invention are obtained from the subclaims, from the drawings and from the associated figure description by way of the drawings.

It is to be understood that the features mentioned above and still to be explained in the following cannot only be used in the respective combination stated but also in other combinations or by themselves without leaving the scope of the present invention.

Preferred exemplary embodiments of the invention are shown in the drawings and are explained in more detail in the following description, wherein same reference characters relate to same or similar or functionally same components.

BRIEF DESCRIPTION OF THE DRAWINGS

It shows, in each case schematically.

DETAILED DESCRIPTION

Figure 1:
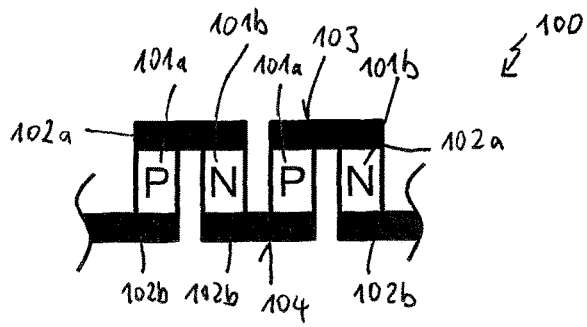
FIG. 1 shows the fundamental construction of a thermoelectric device with thermoelectrically active elements.

FIG. 1 illustrates the fundamental construction of a conventional thermoelectric element 100. The same comprises a plurality of p and n-doped electric semiconductors 101a, 101b, which are alternately electrically contacted in series with each other. The electrical contacting is affected by means of electrical bridges 102a, which simultaneously form a hot side 103 of the thermoelectric element 100, and by means of second electrical bridges 102b, which form a cold side 104 of the thermoelectric element 100 and are located opposite the first electrical bridges 102a.

Figures 2, 3:
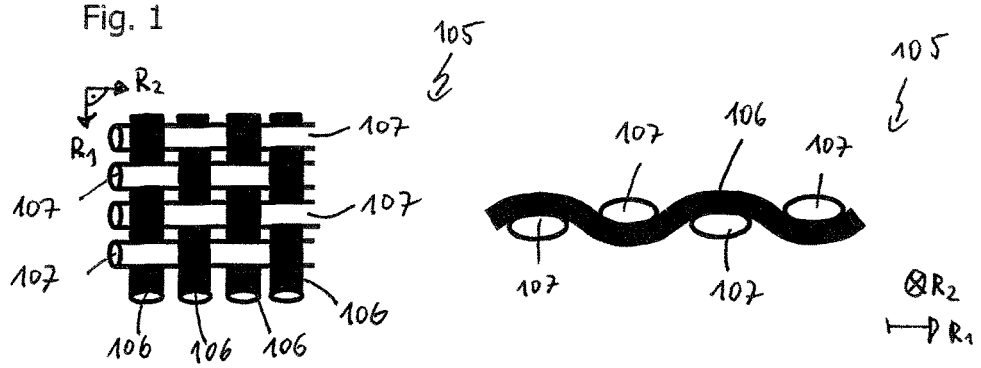
FIGS. 2 and 3 shows the fundamental construction of a fabric with warp threads and weft threads in a top view of lateral view.

The FIGS. 2 and 3 illustrate the fundamental construction of a conventional fabric 105 in a top view of lateral view. According to FIG. 2, the fabric 105 comprises a plurality of warp threads 106 which extend along a first direction $R_1$ parallel to each other. A plurality of weft threads 107 extend parallel to each other along a second direction $R_2$, which runs perpendicularly or at least substantially perpendicularly to the first direction $R_1$. The warp threads 106 are connected to the weft threads 107 through the connection type "cross hair connection". This means that the warp threads 106 alternately extend over and under the transverse weft threads 107 in a certain rhythm known as "weave" to the person skilled in the art. Accordingly, the warp threads 107 alternately extend over and below the transverse warp threads 106.

Figure 4:
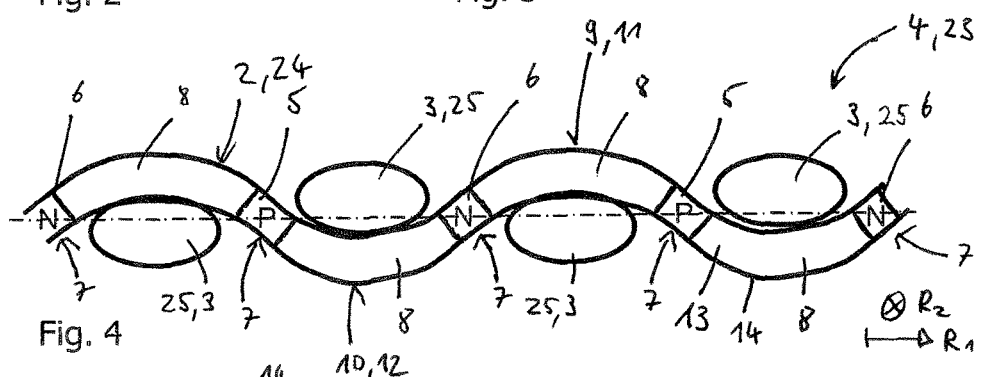
FIG. 4 shows an example of a thermoelectric device according to the invention.

FIG. 4 now shows an example of a thermoelectric device 1 according to the invention in a cross section. The thermoelectric device 1 comprises a plurality of first threads 24 in the form of electrically conductive warp threads 2 and a plurality of second threads 25 in the form of electrically insulating weft threads 3 which together form a fabric 4. The arrangement of the warp threads and weft threads 2, 3 corresponds to the arrangement of the warp threads and weft threads 106, 107 explained for a conventional fabric 105 by way of the FIGS. 2 and 3. Accordingly, FIG. 4 shows the fabric 4 of the thermoelectric device 1 according to the invention in a representation which corresponds to that of the FIG. 3 for the conventional fabric 105. For this reason, only a single warp thread 2 is shown in FIG. 4 which extends along a first direction $R_1$. Furthermore, four weft threads 3 are exemplarily shown, which extend along a second direction $R_2$, which runs perpendicularly to the first direction $R_1$—in the example of FIG. 4 perpendicularly to the drawing plane.

For forming the fabric 4 as thermoelectrically active element, a plurality of p-doped thread sections 5 and n-doped thread sections 6 are alternately arranged in each warp thread 2. The fabric 4 is preferentially designed as a flat structure 23.

According to FIG. 4, the warp threads 2 in the fabric 4 follow a wavy course with a plurality of curvature-turning points 7. Preferentially, the p and n-doped thread sections 5, 6 are arranged in a respective curvature-turning point 7. Adjacent thread sections 5, 6 are preferentially arranged spaced from each other, so that between two adjacent thread sections 5, 6 with p or n-doping a thread section 8 without doping can be provided in each case. These thread sections 8 correspond to the first and second electrical bridges 102a, 102b already shown in connection with FIG. 1.

The p-doped and the n-doped thread sections 5, 6 are arranged in the warp threads 2 in such a manner that a first side 9 of the fabric 4 forms a hot side 11 and a second side 10 of the fabric 4 located opposite the first side 9 forms a cold side 12 (see FIG. 4) or vice versa (not shown in the figures). The thread sections 8 act as hot side or cold side of the thermoelectric device 1 depending on the side on which they are arranged relative to the weft threads 3.

A warp thread 2 comprises an electrically conductive conductor 13 which is surrounded by an electrically insulating sheath. In this way, undesirable electrical short circuits of the electrically conductive warp threads 2 with other electrically conducting materials in the surroundings of the fabric 4 of among each other can be excluded. The electrical conductor 13 is preferably a metal such as for example copper. The sheath preferentially consists of a plastic or comprises such a plastic. A sheath thickness of the electrically insulating sheath 14 can be increased for the purpose of pull relief in the transition region 26 between a p or n-doped thread section 5, 6 and the thread section 8 without doping adjacent thereto.

The warp threads 3 are preferentially not only designed electrically insulating but also thermally insulating. In this way, undesirable heat bridges between the hot side 11 and the cold side 12 can be prevented. In a version that is not shown in the figures, the warp threads 2 and/or the weft threads 3 can also be formed ribbon-like for increasing the heat transfer output. The electrically insulating weft threads 3 can consist of a plastic.

Figure 5:
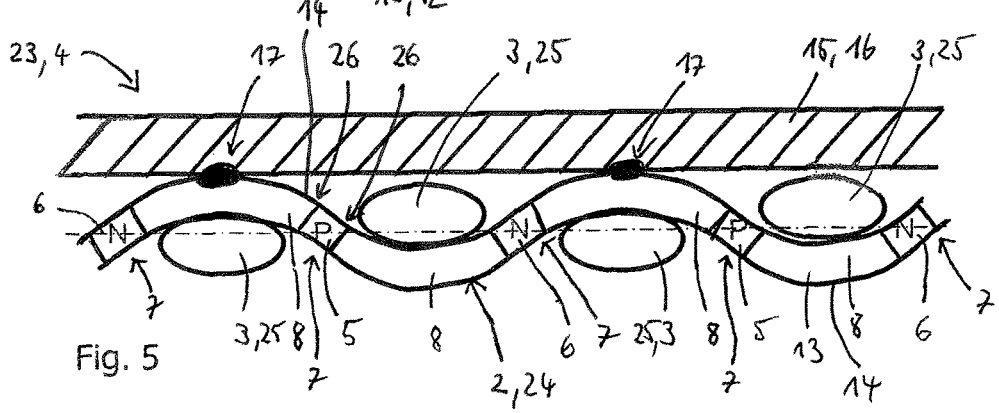
FIG. 5 shows a further development of the thermoelectric device of FIG. 4.

FIG. 5 shows a further development of the thermoelectric device 1 of the FIG. 1. In the version according to FIG. 5, a heat accumulator for buffer-storing heat is arranged on the hot side, which for the thermal coupling lies against the warp threads 2. The heat accumulator 15 can be designed as plate-like heat storage plate 16, which is fastened to the warp threads 2 by means of a thermally conductive adhesive means 17, for example a heat-transferring adhesive.

Figure 8:
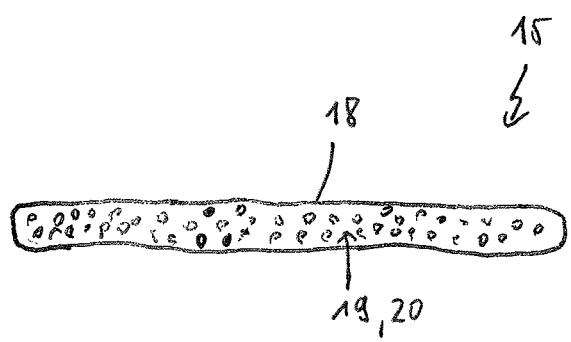
FIG. 8 shows a schematic representation of a heat accumulator interacting with the thermoelectric device.

Preferably, heat accumulator 15 or the heat storage plate 16 comprises a mechanically flexible material. In FIG. 8, a possible technical form or realising such a mechanically flexible heat accumulator 15 is schematically shown. The same comprises a flexible envelope 18, preferentially of a metal, in which a liquid 19 or a PCM material 20 for the buffer storing of the heat is arranged. Particularly preferably, the envelope 18 can be formed as a metal film.

Figure 6:
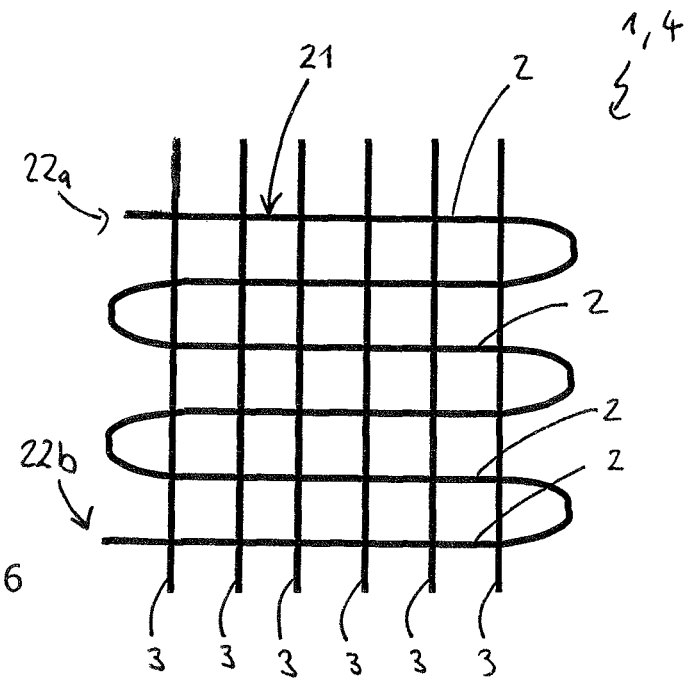
FIG. 6 shows a first example for a possible electrical wiring of the warp threads of the thermoelectric device.

In FIG. 6, a possible arrangement of the warp threads 2 and the weft threads 3 is shown in a top view of the hot side 11 (an optionally present heat accumulator 15 is not shown in FIG. 6). As is evident from FIG. 6, all present warp threads 2 are moulded integrally against each other and in this way electrically connected to each other in series. The resulting total thread 21 comprises a first end section 22a and a second end section 22b located opposite the first end section 22a, which can both be connected to an electric voltage supply (not shown in FIG. 6). The warp threads 2 forming the total thread 21 are arranged meander-like in the top view of the first side 9 or of the hot side 11 of the fabric 4 shown in FIG. 6. The individual warp threads 2 in this version are electrically connected to each other in series so that for operating the thermoelectric device 1 only the two end sections 22a, 22b have to be connected to an electric voltage supply.

Figure 7:
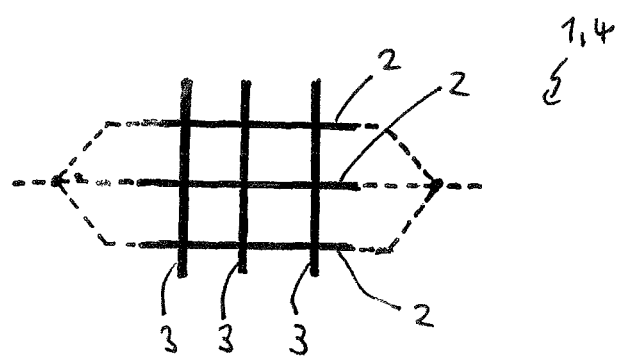
FIG. 7 shows a second example of a possible electrical wiring of the weft threads of the thermoelectric device.

Compared with this, FIG. 7 shows a version of the arrangement of FIG. 6 in which all existing warp threads 2 are electrically interconnected in parallel with each other.

Figure 9:
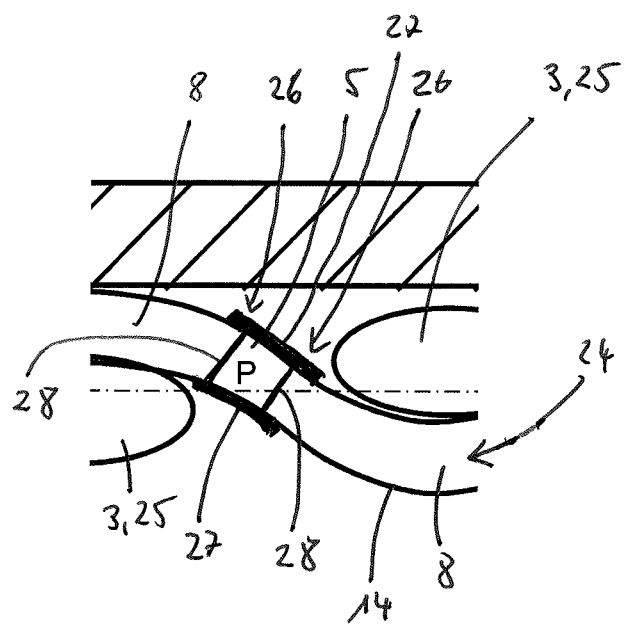
FIG. 9 shows a further development of the example of FIG. 5 in a detail representation.

FIG. 9 shows a further development of the thermoelectric device 1 of the FIG. 5. Accordingly, an additional sheathing 27 for the pull relief of the first thread 24 can be provided in the transition region 26 of the first thread 24 between a p or n-doped thread section 5, 6—FIG. 9 exemplarily shows a p-doping—and the thread section 8 adjacent thereto. The sheathing 27 can be provided additionally to the electrically insulating sheath 14 and as shown in FIG. 9 extend over the entire p-doped thread section 6. The additional sheathing 27 thus protrudes into the thread section 8 without doping so that the boundary surfaces 28 between p or the n-doped thread section 5, 6 and the thread section 8 without doping are relieved.

The invention claimed is:

1. A thermoelectric device, comprising:
   a plurality of electrically conductive first threads and a plurality of electrically insulating second threads structured and arranged to define a fabric;
   at least one first thread of the plurality of electrically conductive first threads including a plurality of p-doped thread sections and a plurality of n-doped thread sections arranged in alternating relationship with one another; and
   the plurality of electrically conductive first threads extending in a wavy course defining a plurality of curvature-turning points;
   wherein the plurality of p-doped thread sections and the plurality of n-doped thread sections are arranged in a respective curvature-turning point of the plurality of curvature-turning points; wherein one of: the plurality of electrically conductive first threads are arranged as warp threads of the fabric, and the plurality of electrically insulating second threads are arranged as weft threads of the fabric; and the plurality of electrically conductive first threads are arranged as the weft threads of the fabric, and the plurality of electrically insulating second threads are arranged as the warp threads of the fabric.

2. The thermoelectric device according to claim 1, wherein the plurality of electrically insulating second threads are thermally insulating.

3. The thermoelectric device according to claim 1, wherein the plurality of p-doped thread sections and the plurality of n-doped thread sections are arranged such that one of:
   a first side of the fabric is structured as a hot side and a second side of the fabric disposed opposite the first side is structured as a cold side; and
   the first side is structured as the cold side and the second side is structured as the hot side.

4. The thermoelectric device according to claim 1, wherein each first thread of the plurality of electrically conductive first threads includes an electrically conductive conductor surrounded by an electrically insulating sheath.

5. The thermoelectric device according to claim 1, wherein at least one of i) the plurality of electrically conductive first threads and ii) the plurality of electrically insulating second threads are structured in a ribbon-like manner.

6. The thermoelectric device according to claim 1, wherein the plurality of electrically conductive first threads are electrically connected in series with each other.

7. The thermoelectric device according to claim 1, wherein the plurality of electrically conductive first threads, when viewed from an elevated view of a first side of the fabric or a second side of the fabric disposed opposite the first side, are arranged to extend in a meander course.

8. The thermoelectric device according to claim 1, wherein at least two first threads of the plurality of electrically conductive first threads are electrically connected parallel to each other.

9. The thermoelectric device according to claim 3, further comprising a heat accumulator for buffer-storing heat arranged on the hot side and thermally coupled to at least one of the plurality of electrically conductive first threads, wherein each first thread of the plurality of electrically conductive first threads includes an electrically conductive conductor surrounded by an electrically insulating sheath.

10. The thermoelectric device according to claim 9, wherein the heat accumulator is a heat storage plate connected via a thermally conductive adhesive to at least one of the plurality of electrically conductive first threads.

11. The thermoelectric device according to claim 9, wherein the heat accumulator is composed of a mechanically flexible material.

12. The thermoelectric device according to claim 9, wherein the heat accumulator includes a flexible envelope and at least one of a liquid and a PCM material for buffer storing of heat arranged within the flexible envelope.

13. The thermoelectric device according to claim 4, wherein the at least one first thread includes a plurality of thread sections without doping arranged between adjacent p-doped thread sections of the plurality of p-doped thread sections and n-doped thread sections of the plurality of n-doped thread sections, wherein a sheath thickness of the electrically insulating sheath increases in at least one transition region arranged between a thread section without doping of the plurality of thread sections without doping and one of i) the adjacent p-doped thread section and ii) the adjacent n-doped thread section.

14. The thermoelectric device according to claim 13, wherein the at least one transition region includes an additional sheathing structured for pull relief.

15. An air conditioning system, comprising at least one thermoelectric device including:
   a plurality of electrically conductive first threads and a plurality of electrically insulating second threads structured and arranged to define a fabric;
   at least one first thread of the plurality of electrically conductive first threads including a plurality of p-doped thread sections and a plurality of n-doped thread sections arranged alternately with the plurality of p-doped thread sections; and
   the plurality of electrically conductive first threads extending in a wavy course defining a plurality of curvature-turning points;
   wherein the plurality of p-doped thread sections and the plurality of n-doped thread sections are arranged in a respective curvature-turning point of the plurality of curvature-turning points; wherein one of: the plurality of electrically conductive first threads are arranged as warp threads of the fabric, and the plurality of electrically insulating second threads are arranged as weft threads of the fabric; and the plurality of electrically conductive first threads are arranged as the weft threads of the fabric, and the plurality of electrically insulating second threads are arranged as the warp threads of the fabric.

16. The air conditioning system according to claim 15, wherein the plurality of electrically conductive first threads and the plurality of electrically insulating second threads are woven together such that the warp threads alternately extend over and under the weft threads, and wherein the warp threads extend parallel to each other in a first direction and the weft threads extend parallel to each other in a second direction running transversely to the first direction.

17. The thermoelectric device according to claim 1, wherein the plurality of electrically conductive first threads and the plurality of electrically insulating second threads are woven together and alternatingly extend over and under one another to define the fabric.

18. The thermoelectric device according to claim 1, wherein the plurality of curvature-turning points are respectively disposed on each of the plurality of electrically conductive first threads between a thread section having a curvature oriented in a first direction and another thread section having a curvature oriented in a second direction opposite the first direction.

* * * * *